United States Patent
Wang (10) Patent No.: US 7,436,680 B2
(45) Date of Patent: Oct. 14, 2008

(54) MULTI-CHIP BUILD-UP PACKAGE OF OPTOELECTRONIC CHIP

(75) Inventor: Chien-Hao Wang, Hsinchu County (TW)

(73) Assignee: Advanced Semiconductor Engineering, Inc., Kaohsiung (TW)

(*) Notice: Subject to any disclaimer, the term of this patent is extended or adjusted under 35 U.S.C. 154(b) by 146 days.

(21) Appl. No.: 11/608,112

(22) Filed: Dec. 7, 2006

(65) Prior Publication Data
US 2007/0160319 A1      Jul. 12, 2007

(30) Foreign Application Priority Data
Jan. 11, 2006    (TW)    ............... 95100992 A (51) Int. Cl.
*H05K 1/18*    (2006.01)
(52) U.S. Cl. .......................... 361/763; 439/71
(58) Field of Classification Search ............ 439/71; 361/763–766
See application file for complete search history.

(56) References Cited

U.S. PATENT DOCUMENTS 5,745,984 A * 5/1998 Cole et al. .................. 29/834
6,555,906 B2 * 4/2003 Towle et al. ................ 257/723
6,972,964 B2 * 12/2005 Ho et al. ..................... 361/761

FOREIGN PATENT DOCUMENTS

TW    M246808    10/2004

* cited by examiner

*Primary Examiner*—Phuong K Dinh
(74) *Attorney, Agent, or Firm*—J.C. Patents (57) ABSTRACT

A multi-chip build-up package of an optoelectronic chip mainly includes a metal carrier, an IC chip, an optoelectronic chip, a build-up packaging structure including a plurality of dielectric layers and a plurality of wiring layers, and a transparent conductive substrate. The IC chip is disposed on the metal carrier and is covered by one of the dielectric layers, and a plurality of electrodes of the IC chip is electrically connected to the wiring layers. The optoelectronic chip is partially embedded in one of the dielectric layers such that an optoelectronic working region and a plurality of electrodes of the optoelectronic chip are exposed. The transparent conductive substrate is disposed on the dielectric layers and the optoelectronic chip, and the wiring layers electrically connect the optoelectronic chip and the IC chip. Accordingly, the embedded IC chip and optoelectronic chip can be electrically interconnected together in build-up process.

15 Claims, 8 Drawing Sheets

MULTI-CHIP BUILD-UP PACKAGE OF OPTOELECTRONIC CHIP

CROSS-REFERENCE TO RELATED APPLICATION

This application claims the priority benefit of Taiwan application serial no. 95100992, filed Jan. 11, 2006. All disclosure of the Taiwan application is incorporated herein by reference.

BACKGROUND OF THE INVENTION

1. Field of Invention

The present invention relates to an optoelectronic chip packaging technology. More particularly, the present invention relates to a multi-chip build-up package of an optoelectronic chip.

2. Description of Related Art

Optoelectronic chips have been applied in video electronic products to provide various functions such as image sensing, image displaying, illuminating, optical storage, optical output, or optical input. As the optoelectronic chips usually have a large package size, the assembly space for the video electronic products is occupied and the electrical transmission path is quite long, thus a cross-talk effect easily occurs.

Figure 1:
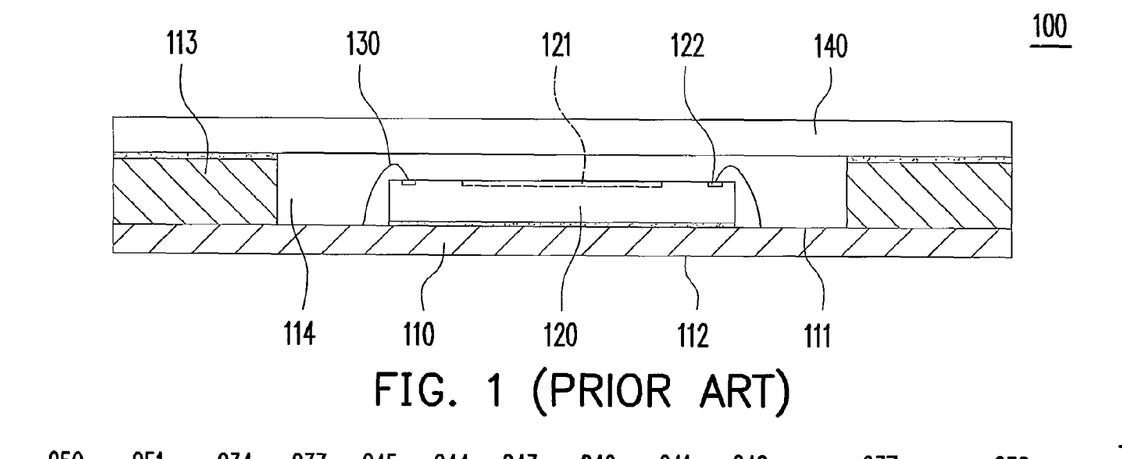
FIG. 1 is a schematic cross-sectional view of a conventional optoelectronic chip package of an image sensor.

Referring to FIG. 1, an optoelectronic chip package 100 of an image sensor is in the form of single chip package and mainly includes a substrate 110, an optoelectronic chip 120, a plurality of bonding wires 130, and a transparent plate 140. The substrate 110 has an upper surface 111, a lower surface 112, and a wiring structure (not shown) electrically conducting the upper surface 111 and the lower surface 112. The substrate 110 usually is a multi-layer printed circuit board. An annular wall 113 is formed with the upper surface 111 of the substrate 110, so that the substrate 110 and the annular wall 113 form a chip accommodating cavity 114. The optoelectronic chip 120 is an image sensing chip, and is disposed on the upper surface 111 of the substrate 110 by means of adhering and is located in the chip accommodating cavity 114. A sensing region 121 and a plurality of bonding pads 122 are formed on the active surface of the optoelectronic chip 120. The bonding wires 130 are formed in the chip accommodating cavity 114 by means of wiring process, and are electrically connected to the bonding pads 122 of the optoelectronic chip 120 and the substrate 110. The transparent plate 140 is disposed on the annular wall 113, so as to seal the optoelectronic chip 120 and the bonding wires 130. In the above optoelectronic chip package 100, the optoelectronic chip 120 is electrically conducted to a digital signal processor chip (not shown) on an external circuit board via the bonding wires 130 and the substrate 110, and the transmission path is relatively long, so that the image cannot be quickly processed and thus the cross-talk effect easily occurs.

Taiwan patent No. M246808 entitled "Build-up Structure for Image Sensor" has disclosed an image sensor package including a wiring build-up structure. An image sensing chip is accommodated in a chip cavity of a substrate, and the image sensing chip has a sensing region facing upward. The wiring build-up structure is formed on the image sensing chip of the substrate. As the wiring build-up structure is formed on the active surface of the image sensing chip and the substrate, the sensing region of the image sensing chip may be easily contaminated in the build-up package process. The wiring build-up structure must have a window which cannot shield the sensing region. Thus, the conductive wiring arranged in the wiring build-up structure is limited and cannot become compact. Moreover, it is required to reserve a window in the wiring build-up structure, so that the manufacturing cost is increased.

SUMMARY OF THE INVENTION

Accordingly, the present invention is directed to provide a multi-chip build-up package of an optoelectronic chip. An IC chip, a build-up packaging structure, and an optoelectronic chip are successively stacked above a metal carrier. The IC chip and the optoelectronic chip are embedded in a plurality of dielectric layers of the build-up packaging structure. A plurality of wiring layers of the build-up packaging structure is used with a transparent conductive substrate and a plurality of conductive elements to electrically interconnect the IC chip and the optoelectronic chip embedded in the dielectric layers, such that the electrically transmission paths between the chips are reduced thereby accelerating the optoelectronic working speed. Moreover, the build-up packaging structure has no impact on an optoelectronic working region of the optoelectronic chip, and compact wiring layers can be obtained. According to the present invention, thin optoelectronic products can be obtained and the electrical interconnection and the encapsulation of the embedded IC chip and optoelectronic chip can be improved. Thus, the assembly, the interconnection reliability, and the electrical performance are improved, the packaging density is increased, and the cross-talk effect is reduced.

The present invention is also directed to provide a multi-chip build-up package of an optoelectronic chip. A dielectric layer of the build-up packaging structure has a plurality of through holes penetrating to the metal carrier for facilitating the electrical interconnection between the wiring layers and the metal carrier of the build-up packaging structure, which can be used as the power supply or the power ground. The metal carrier is preferably patterned to have a plurality of connection pads for external transmission.

The present invention is further directed to provide a multi-chip build-up package of an optoelectronic chip, wherein the metal carrier is patterned to have a plurality of connection pads and a heat sink portion, and the heat sink portion can be attached to the IC chip embedded in the dielectric layers to enhance the heat sink effect of the embedded IC chip.

According to the present invention, a multi-chip build-up package of an optoelectronic chip mainly comprises a metal carrier, an IC chip, an optoelectronic chip, a build-up packaging structure including a first dielectric layer, a second dielectric layer, and a first wiring layer, a plurality of conductive elements, and a transparent conductive substrate. The IC chip is disposed on the metal carrier and has a plurality of first electrodes. The first dielectric layer is formed on the metal carrier, and covers the IC chip and exposes the first electrodes. The first wiring layer is formed on the first dielectric layer, and is electrically connected to the first electrodes. The optoelectronic chip is disposed above the first dielectric layer, and has a plurality of second electrodes and an optoelectronic working region. The second dielectric layer is formed above the first dielectric layer to partially cover the optoelectronic chip and expose the second electrodes and the optoelectronic working region. The conductive elements are electrically connected to the first wiring layer and are exposed outside the second dielectric layer. The transparent conductive substrate is disposed on the second dielectric layer and the optoelectronic chip, and a conductive wiring layer of the transparent conductive substrate is used to electrically connect the conductive elements and the second electrode, thereby the electrical interconnection of the build-up embedded IC chip and optoelectronic chip is achieved.

In order to make the aforementioned and other objects, features and advantages of the present invention comprehensible, preferred embodiments accompanied with figures are described in detail below.

DESCRIPTION OF EMBODIMENTS

Figure 2:
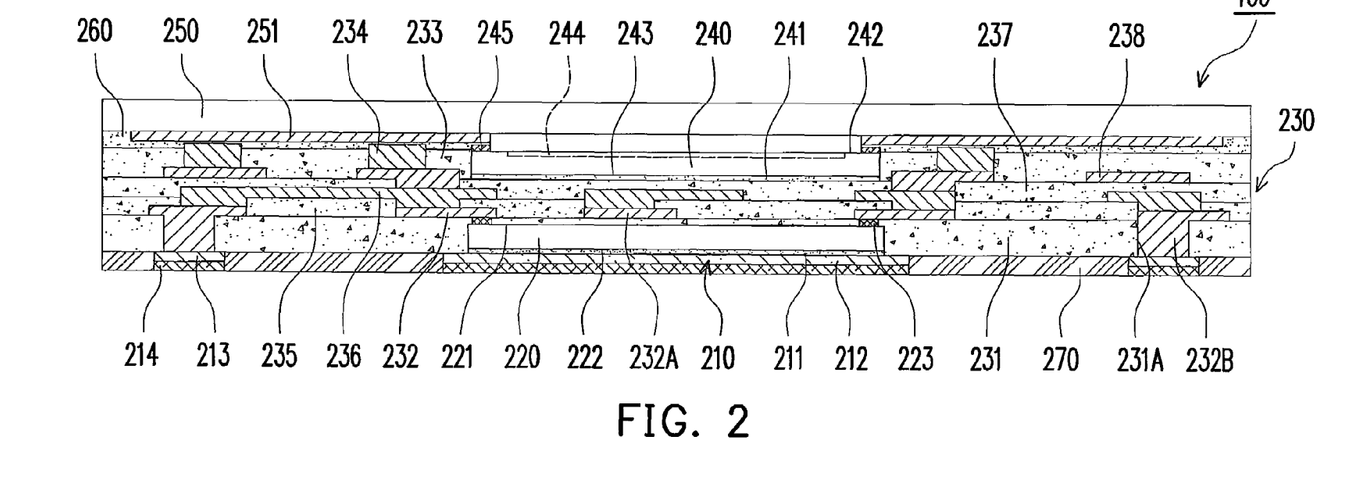
FIG. 2 is a schematic cross-sectional view of a multi-chip build-up package of an optoelectronic chip according to a specific embodiment of the present invention.

Referring to FIG. 2, a multi-chip build-up package 200 of an optoelectronic chip mainly includes a metal carrier 210, an IC chip 220, a build-up packaging structure 230 including at least two dielectric layers and at least one wiring layer, a optoelectronic chip 240, and a transparent conductive substrate 250. In this embodiment, the metal carrier 210 is a copper foil and is patterned. Before patterning, the build-up packaging structure 230 is formed on the metal carrier 210. The build-up packaging structure 230 includes at least a first dielectric layer 231, a first wiring layer 232, a second dielectric layer 233, a plurality of conductive elements 234 located on the second dielectric layer 233, a third dielectric layer 235, a second wiring layer 236, a fourth dielectric layer 237, and a third wiring layer 238, which are built up on the metal carrier 210. The material of the dielectric layers such as the first dielectric layer 231, the second dielectric layer 233, the third dielectric layer 235, and the fourth dielectric layer 237 is an electrical insulating material such as Polyimide (PI) or Poly ethylene terephthalate (PET). The material of the first wiring layer 232, the second wiring layer 236, the third wiring layer 238, and the conductive elements 234 is a conducting metal such as copper or gold.

The IC chip 220 has an active surface 221 and a back surface 222, and has a plurality of first electrodes 223 formed on the active surface 221. The IC chip 220 is adhered on the back surface 222 to the metal carrier 210 by an adhering layer 211. The first electrodes 223 can be bumps or bonding pads etc. In this embodiment, the first dielectric layer 231 of the build-up packaging structure 230 is formed on the metal carrier 210 to cover the IC chip 220 and expose the first electrodes 223. The first wiring layer 232 is formed on the first dielectric layer 231 and is electrically connected to the first electrodes 223. The first dielectric layer 231 is higher than the active surface 221 of the IC chip 220 and covers to the active surface 221, so as to achieve the electrical insulating function. In this embodiment, the first wiring layer 232 has a plurality of extending wirings 232A extending above the IC chip 220, so as to increase the wiring density. In addition, the first dielectric layer 231 has a plurality of through holes 231A penetrating to the metal carrier 210. The conductive materials 232B such as the electroplated coating, metal plug, and conductive resin are formed in the through holes 231A, so as to electrically connect the first wiring layer 232 and the metal carrier 210, which can be used as the power supply or the power ground.

As shown in FIG. 2, the optoelectronic chip 240 is disposed above the first dielectric layer 231, and can be adhered above the first dielectric layer 231 by an adhering layer 241. The optoelectronic chip 240 has an active surface 242 and a back surface 243, a plurality of second electrodes 245 and an optoelectronic working region 244 are formed on the active surface 242. The optoelectronic chip 240 preferably is vertically aligned with the IC chip 220, so as to decrease the surface footprint area of the multi-chip build-up package 200 of the optoelectronic chip.

The second dielectric layer 233 is formed above the first dielectric layer 231, and partially covers the optoelectronic chip 240 and exposes the second electrodes 245 and the optoelectronic working region 244, so as to achieve partially embedding the optoelectronic chip 240. In this embodiment, the second dielectric layer 233 covers a plurality of side surfaces of the optoelectronic chip 240 between the active surface 242 and the back surface 243. In addition, the conductive elements 234, such as plated through holes, metal plugs, or metal pads are electrically connected to the first wiring layer 232 and are exposed outside the second dielectric layer 233.

The transparent conductive substrate 250 is disposed on the second dielectric layer 233 and the optoelectronic chip 240, and has a conductive wiring layer 251 to electrically connect the conductive elements 234 and the second electrodes 251. In this embodiment, the transparent conductive substrate 250 is a glass substrate having the wiring pattern, and the material of the conductive wiring layer 251 is Indium Tin Oxide (ITO). Preferably, an anisotropic conductive layer 260 in the form of membrane or adhesive and having conductive particles with the same particle diameter is formed between the second dielectric layer 233 and the transparent conductive substrate 250. The second electrodes 245 are bumps. The second electrodes 245 and the conductive elements 234 protrude from the second dielectric layer 233, such that the second electrodes 245 and the conductive elements 234 can be vertically electrically connected to the conductive wiring layer 251 via the anisotropic conductive layer 260 by means of thermo-compression bonding.

In addition, in this embodiment, the third dielectric layer 235 and the fourth dielectric layer 237 are further formed between the first dielectric layer 231 and the second dielectric layer 233 of the build-up package. The third dielectric layer 235 is formed on the first dielectric layer 231 and the first wiring layer 232. The second wiring layer 236 is formed on the third dielectric layer 235 and is electrically to the first wiring layer 232 though the holes of the third dielectric layer 235. Similarly, the fourth dielectric layer 237 is formed on the third dielectric layer 235 and the second wiring layer 236. The third wiring layer 238 is formed on the fourth dielectric layer 237 and is electrically connected to the second wiring layer 236 though the holes of the fourth dielectric layer 237. In this manner, the dielectric layers and the wiring layers can be successively formed thereon until reaching the required number of the wiring layers. The conductive elements 234 can be electrically connected to the first wiring layer 232 via the third wiring layer 238 and the second wiring layer 236. In this embodiment, only two dielectric layers and two wiring layers are illustrated as an example.

Preferably, the IC chip 220 is a digital signal processor (DSP) chip, and the optoelectronic chip 240 is a CMOS (complementary metal oxide semiconductor) image sensor chip. The wiring layers of the build-up packaging structure 230 are used to electrically connect the optoelectronic chip and the IC chip, so that the image information received by the optoelectronic chip 240 can be quickly processed by the IC chip 220.

Accordingly, as the build-up packaging structure 230 formed on a metal carrier 210 and the transparent conductive substrate 250 has the function of embedding the IC chip 220 and the optoelectronic chip 240 and achieving the interconnection of the circuit between the multiple chips, the image signal received by the optoelectronic chip 240 can be quickly processed by the IC chip 220 under a extremely short electrical conducting path, thereby alleviating the cross-talk effect. Further, the wiring layer of the build-up packaging structure 230 can be designed to be compact, so as to acquire the thin optoelectronic products and enhance the electrical interconnection and the encapsulation between the embedded IC chip 220 and optoelectronic chip 240. Therefore, the assembly, the interconnection reliability, and the electrical performance are improved, and the packaging density is increased, thereby the optoelectronic package with multiple chips internally electrically interconnected is achieved.

Moreover, the metal carrier 210 can be patterned to form a heat sink portion 212 and a plurality of connection pads 213, and the first dielectric layer 231 has an exposed surface. The heat sink portion 212 is provided for attaching the IC chip 220, so as to enhance the heat dissipation performance and the protection for the IC chip 220. The connection pads 213 are electrically connected to the first wiring layer 232 through the conductive material 232B in the through holes 231A, for subsequent surface bonding process. The multi-chip build-up package 200 of the optoelectronic chip can further include a solder mask layer 270 formed on the exposed surface of the first dielectric layer 231, so as to obstruct the inappropriate bridge short-circuit of the solder during the surface bonding process. The solder mask layer 270 at least exposes the heat sink portion 212 and the connection pads 213, and the heat sink portion 212 and the connection pads 213 have an exposed surface. An electroplated coating 214 such as nickel-gold material can be formed on the exposed surface of the heat sink portion 212 and the connection pads 213, so as to prevent the oxidation of the heat sink portion 212 and the connection pads 213.

The method of fabricating the multi-chip build-up package 200 of the optoelectronic chip is as shown in FIGS. 3A to 3K. First, referring to FIG. 3A, a metal carrier 210 is provided, wherein the metal carrier 210 may be an entire piece of copper foil. The IC chip 220 is attached on the metal carrier 210. Then, referring to FIG. 3B, a digital inkjet printing or a stencil printing method is used to form the first dielectric layer 231 on the metal carrier 210. The digital inkjet printing method is preferably used to form the first dielectric layer 231, such that the first dielectric layer 231 achieve various pattern variations and the thickness difference of the first dielectric layer 231 at different regions can be controlled. For example, the thickness of the first dielectric layer 231 on the active surface 221 of the IC chip 220 may be relatively thin, the thickness of the first dielectric layer 231 on the metal carrier 210 may be relatively thick, and the first electrodes 223 may be exposed at any suitable position. Moreover, the through holes 231 can be formed in the same step as the first electrodes 223 are exposed, or the through holes 231A can be formed by developing, etching, or laser drilling step after the first dielectric layer 231 is formed, in which the through holes 231A penetrate to the metal carrier 210.

Figure 3A:
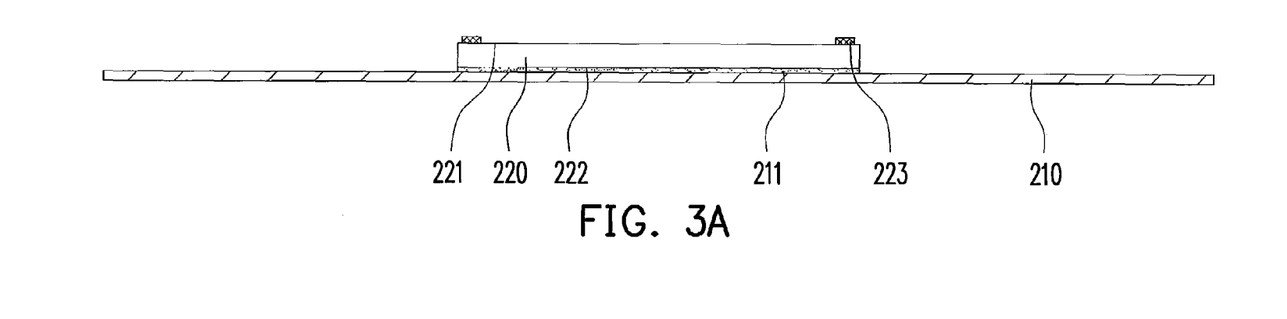
FIGS. 3A to 3K are schematic cross-sectional views of the multi-chip build-up package of an optoelectronic chip according to a first specific embodiment of the present invention.
Figures 3B, 3C:
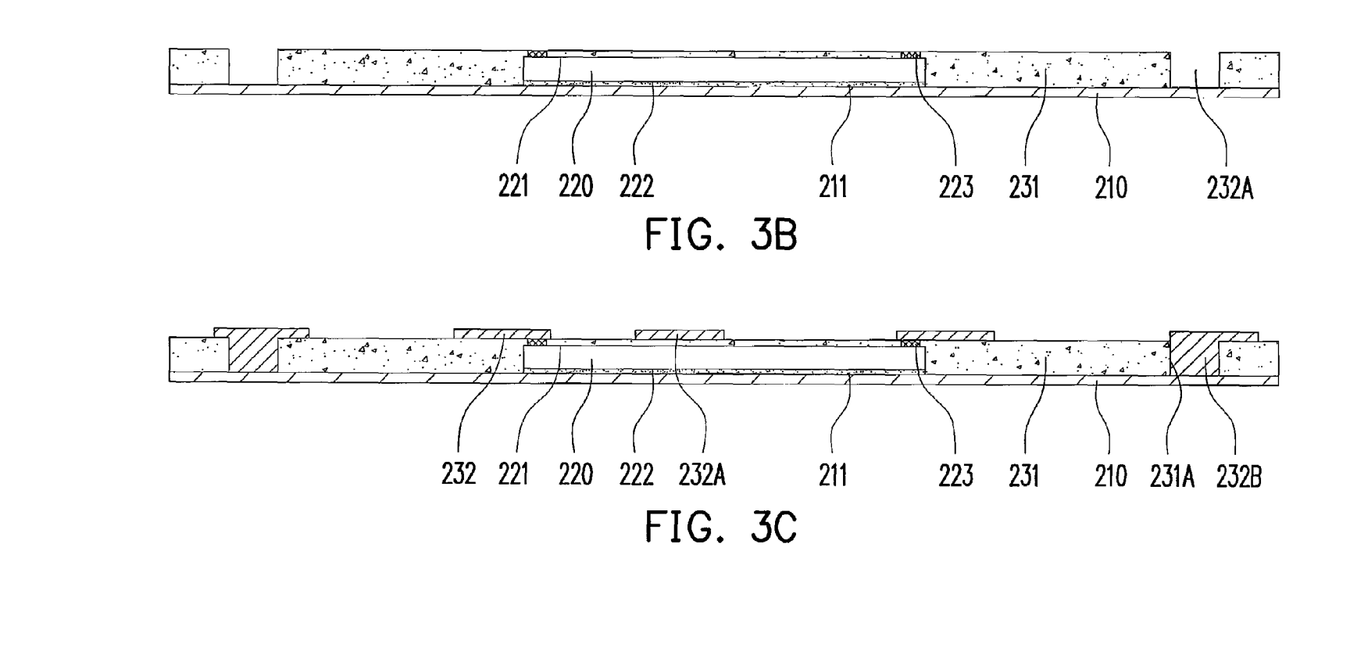

Next, referring to FIG. 3C, the first wiring layer 232 is formed on the first dielectric layer 231 by depositing or electroplating. A part of the wirings of the first wiring layer 232 can be connected to the first electrodes 223, and the other part of the wirings of the first wiring layer 232 can be connected to the metal carrier 210 though the conductive material 232B in the through holes 231A. In addition, a part of the extending wirings 232A can be formed on the first dielectric layer 231 and located above the IC chip 220.

Figure 3D:
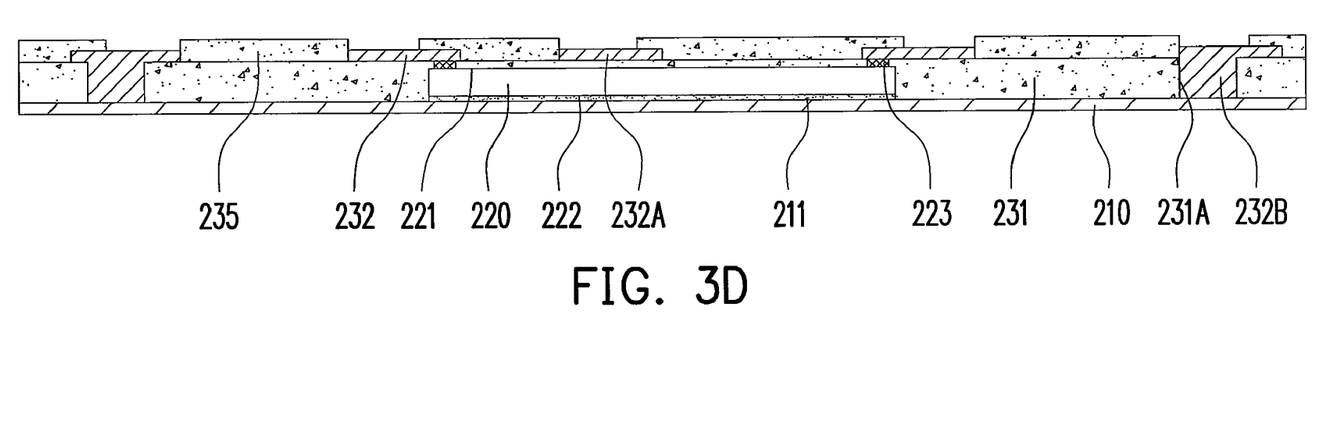
Figure 3E:
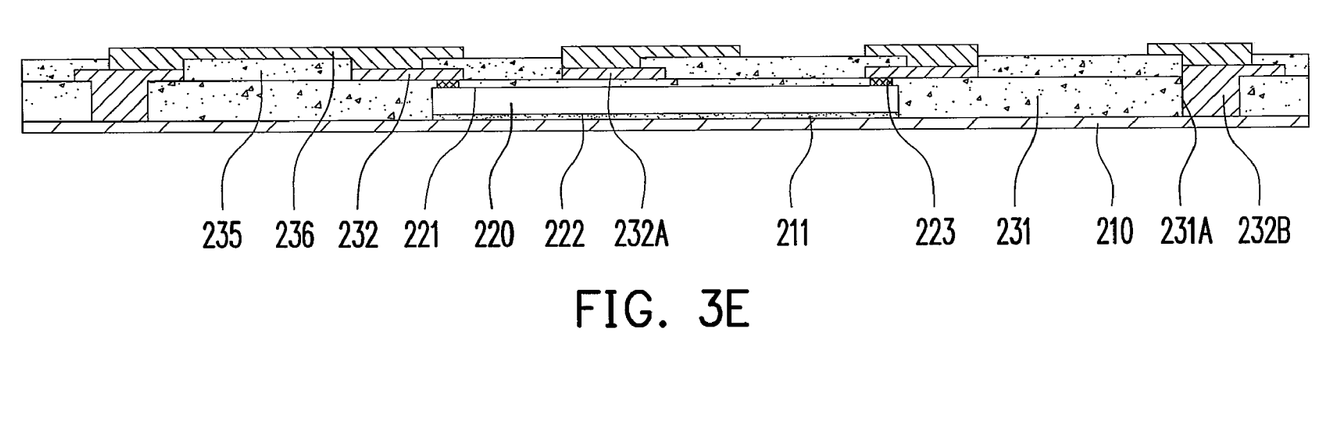
Figure 3F:
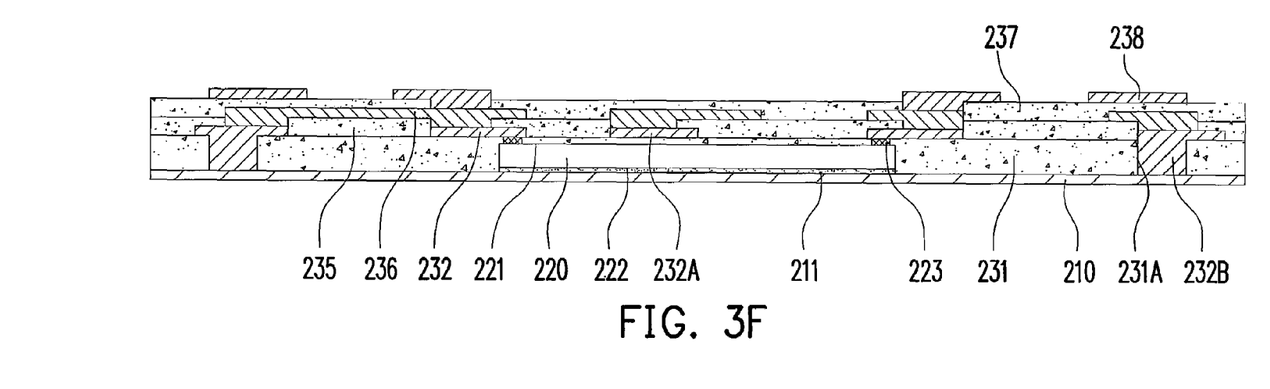

Thereafter, referring to FIG. 3D, the third dielectric layer 235 is formed on the first dielectric layer 231 and the first wiring layer 232, and the internal connection end of the first wiring layer 232 is exposed. Referring to FIG. 3E, the second wiring layer 236 is formed on the third dielectric layer 235 and is electrically connected to the first wiring layer 232 through the holes of the third dielectric layer 235. Similarly, as shown in FIG. 3F, the fourth dielectric layer 237 is then formed on the third dielectric layer 235 and the second wiring layer 236, and the third wiring layer 238 is formed on the fourth dielectric layer 237 and is electrically connected to the second wiring layer 236.

Figure 3G:
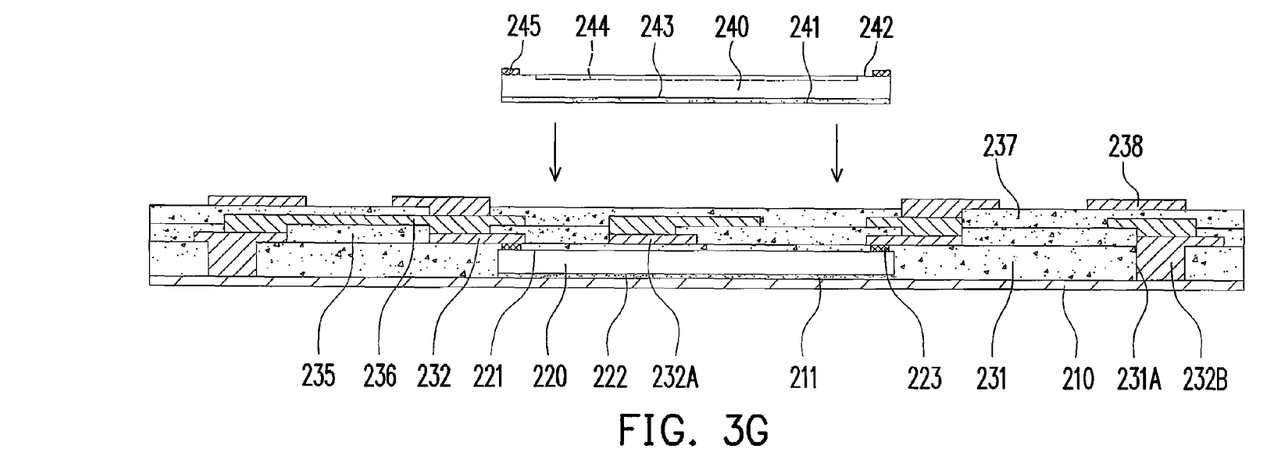

Then, referring to FIG. 3G, a chip bonding technique is used to dispose the optoelectronic chip 240 on the fourth dielectric layer 237 or the third wiring layer 238, i.e., to dispose the optoelectronic chip 240 above the first dielectric layer 231. At this time, the plurality of second electrodes 245 and the optoelectronic working region 244 of the optoelectronic chip 240 face upward.

Figure 3H:
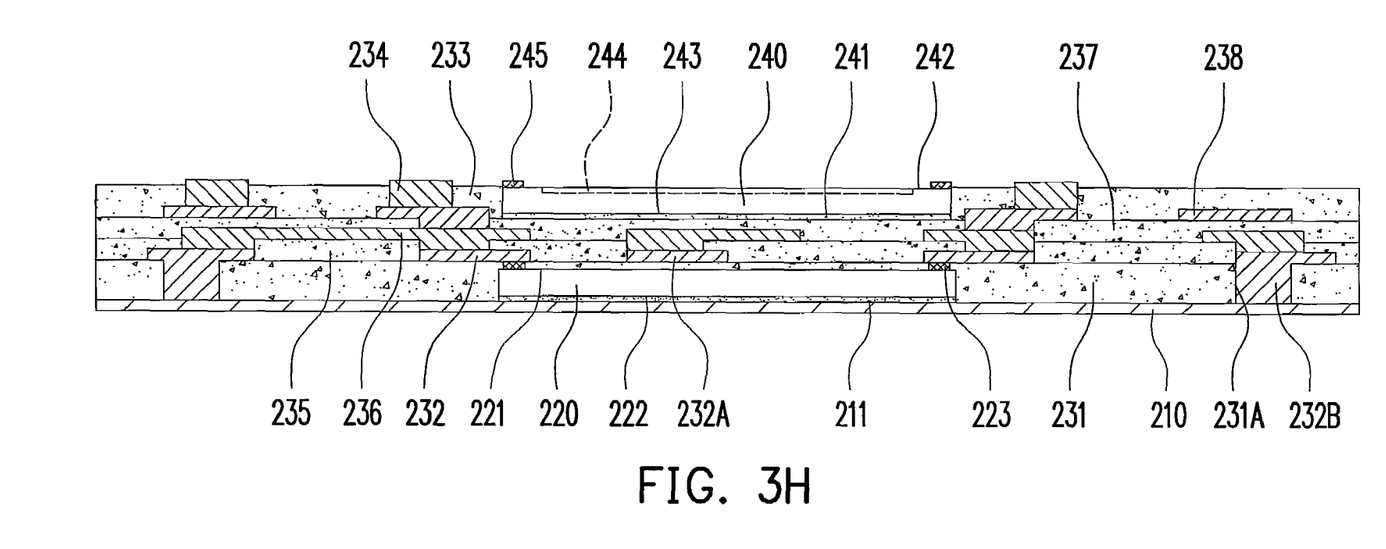

Referring to FIG. 3H, the second dielectric layer 233 is formed on the third wiring layer 238 and the fourth dielectric layer 237, and partially covers the optoelectronic chip 240 and exposes the second electrode 245 and the optoelectronic working region 244. The second dielectric layer 233 is approximately of the same height of the optoeletronic chip 240, or is appreciably higher than the active surface 242 of the optoelectronic chip 240, such that the optoelectronic chip 240 can be in the embedded form. In addition, the second dielectric layer 233 is electrically connected to the third wiring layer 238 via the conductive elements 234 therein, and the conductive element 234 is partially exposed outside the second dielectric layer 233.

Figure 3I:
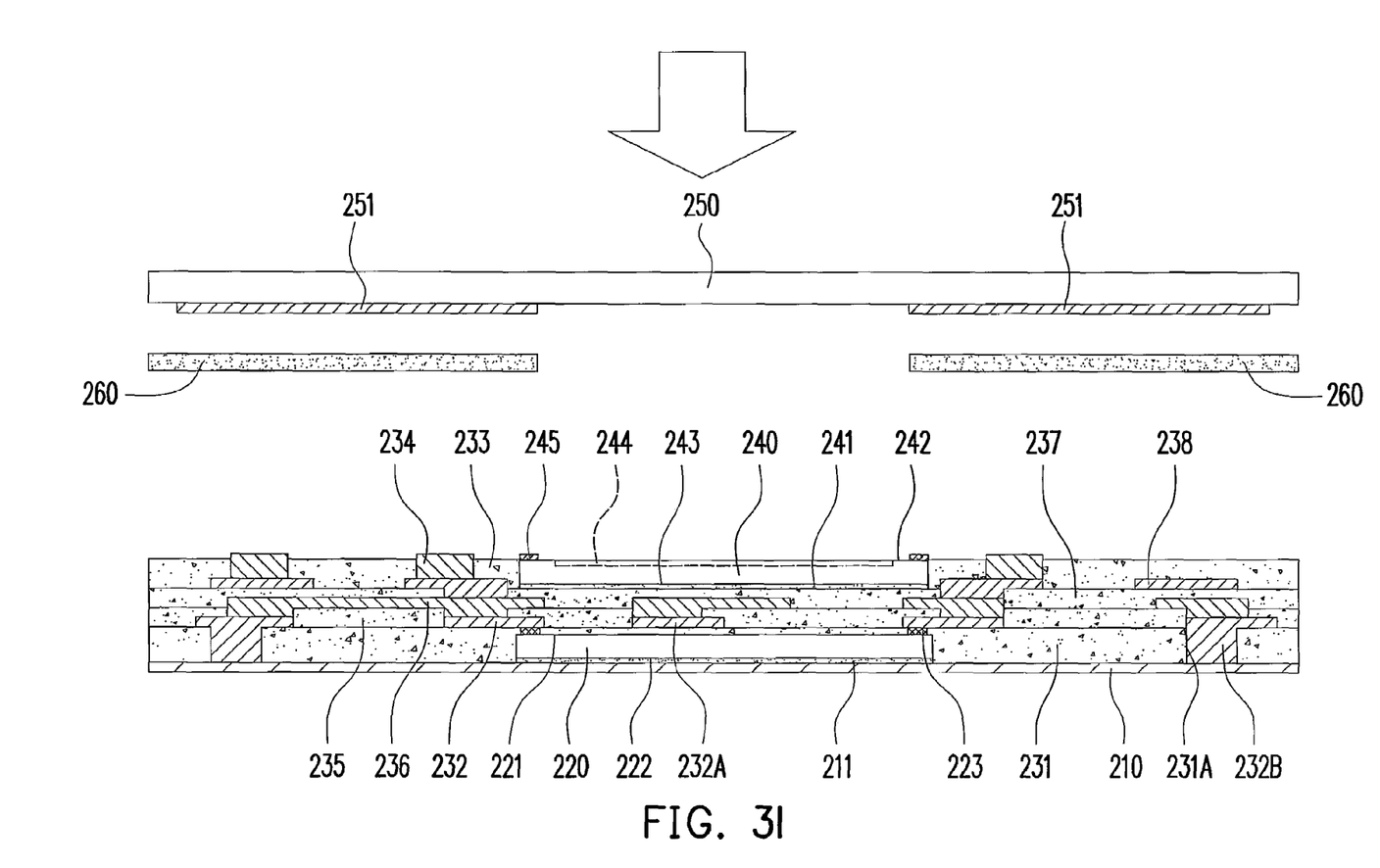
Figure 3J:
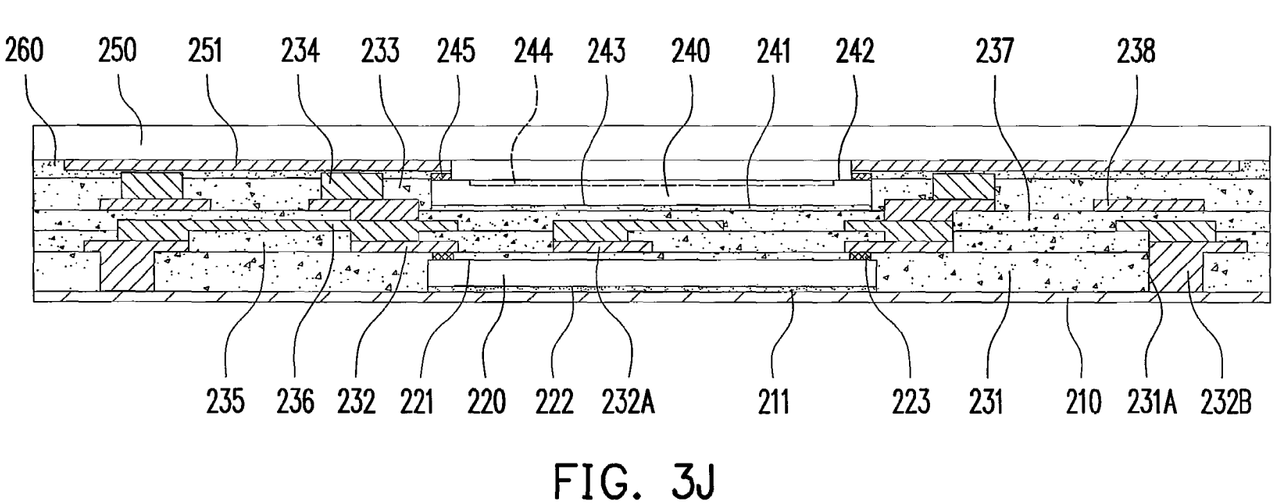

Then, referring to FIG. 3I, the thermocompression bonding method is used to dispose the transparent conductive substrate 250 on the second dielectric layer 233 and the optoelectronic chip 240. As shown in FIG. 3J, the conductive wiring layer 251 of the transparent conductive substrate 250 can be electrically connected to the conductive elements 234 and the second electrodes 245. In this embodiment, in the thermocompression bonding step, an anisotropic conductive layer 260 is preformed between the transparent conductive substrate 250 and the second dielectric layer 233, so as to form the vertically conducting path under the relatively low thermocompression temperature. Therefore, the optoelectronic chip 240 can be internally electrically connected to the IC chip 220 by the transparent conductive substrate 250, the anisotropic conductive layer 260, the conductive elements 234, the third wiring layer 238, the second wiring layer 236, and the first wiring layer 232.

Figure 3K:
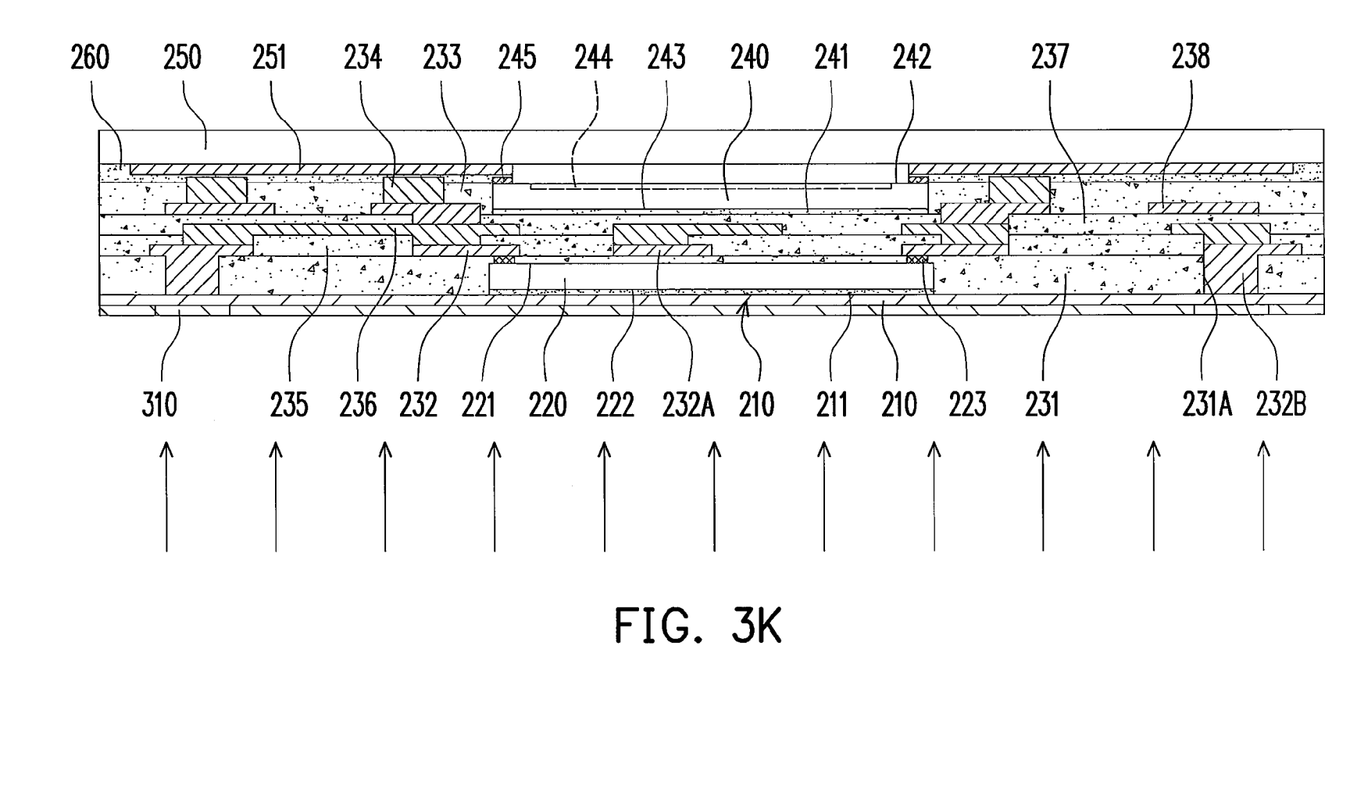

Preferably, the metal carrier 210 can be further patterned. Referring to FIG. 3K, an etching mask 310 covers the metal carrier 210. In this embodiment, the etching mask 310 is a photoresist material, and the pattern is formed after the exposing and developing process. After an etching step, the metal carrier 210 is patterned to form the connection pads 213 and the heat sink portion 212, and the first dielectric layer 231 is made to have an exposed surface (as shown in FIG. 2). The heat sink portion 212 is provided for attaching the IC chip 220, and the connection pads 213 are electrically connected to the first wiring layer 232, and further electrically connected to the IC chip 220 for subsequent surface bonding process. As shown in FIG. 2, the solder mask layer 270 is formed on the exposed surface of the first dielectric layer 231, and exposes the heat sink portion 212 and the connection pads 213 of the metal carrier 210. The heat sink portion 212 and the connection pads 213 have an exposed surface. Then, an electroplated coating 214 is formed on the exposed surface of the heat sink portion 212 and the connection pads 213, and thus the multi-chip build-up package 200 of the optoelectronic chip is fabricated.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A multi-chip build-up package of an optoelectronic chip, comprising:
   a metal carrier;
   an IC chip disposed on the metal carrier and having a plurality of first electrodes;
   a first dielectric layer formed on the metal carrier to cover the IC chip and expose the first electrodes;
   a first wiring layer formed on the first dielectric layer and electrically connected to the first electrodes;
   an optoelectronic chip disposed above the first dielectric layer and having a plurality of second electrodes and an optoelectronic working region;
   a second dielectric layer formed above the first dielectric layer to partially cover the optoelectronic chip and expose the second electrodes and the optoelectronic working region;
   a plurality of conductive elements electrically connected to the first wiring layer and exposed outside the second dielectric layer; and
   a transparent conductive substrate disposed on the second dielectric layer and the optoelectronic chip, and electrically connected to the conductive elements and the second electrodes.

2. The multi-chip build-up package of the optoelectronic chip as claimed in claim 1, wherein the first dielectric layer has a plurality of through holes penetrating to the metal carrier.

3. The multi-chip build-up package of the optoelectronic chip as claimed in claim 1, wherein the metal carrier is patterned, and the first dielectric layer has an exposed surface.

4. The multi-chip build-up package of the optoelectronic chip as claimed in claim 3, further comprising a solder mask layer formed on the exposed surface of the first dielectric layer.

5. The multi-chip build-up package of the optoelectronic chip as claimed in claim 3, wherein the patterned metal carrier is formed with a heat sink portion and a plurality of connection pads, and the heat sink portion and the connection pads have an exposed surface.

6. The multi-chip build-up package of the optoelectronic chip as claimed in claim 5, further comprising an electroplated coating formed on the exposed surface of the heat sink portion and the connection pads.

7. The multi-chip build-up package of the optoelectronic chip as claimed in claim 1, wherein the metal carrier is a copper foil.

8. The multi-chip build-up package of the optoelectronic chip as claimed in claim 1, wherein the first wiring layer has a plurality of wirings extending to above the IC chip.

9. The multi-chip build-up package of the optoelectronic chip as claimed in claim 1, further comprising an anisotropic conductive layer formed between the second dielectric layer and the transparent conductive substrate.

10. The multi-chip build-up package of the optoelectronic chip as claimed in claim 1, wherein at least one third dielectric layer and at least one second wiring layer are further formed between the first dielectric layer and the second dielectric layer, and the second wiring layer electrically connects the conductive elements and the first wiring layer.

11. The multi-chip build-up package of the optoelectronic chip as claimed in claim 1, wherein the optoelectronic chip is longitudinally aligned with the IC chip.

12. The multi-chip build-up package of the optoelectronic chip as claimed in claim 1, wherein the IC chip is a digital signal processor (DSP) chip.

13. The multi-chip build-up package of the optoelectronic chip as claimed in claim 1, wherein the optoelectronic chip is a CMOS (complementary metal oxide semiconductor) image sensor chip.

14. The multi-chip build-up package of the optoelectronic chip as claimed in claim 12, wherein the optoelectronic chip is a CMOS (complementary metal oxide semiconductor) image sensor chip.

15. The multi-chip build-up package of the optoelectronic chip as claimed in claim 1, wherein the first dielectric layer is a digital inkjet printed dielectric layer.

* * * * *